(12) United States Patent
Chang et al.

(10) Patent No.: US 9,013,094 B2
(45) Date of Patent: Apr. 21, 2015

(54) ORGANIC LIGHT EMITTING DISPLAY APPARATUS

(75) Inventors: Yeoung-Jin Chang, Yongin (KR);
Jae-Hwan Oh, Yongin (KR);
Seong-Hyun Jin, Yongin (KR);
Won-Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 331 days.

(21) Appl. No.: 13/482,047

(22) Filed: May 29, 2012

(65) Prior Publication Data

US 2013/0134450 A1 May 30, 2013

(30) Foreign Application Priority Data

Nov. 29, 2011 (KR) .................. 10-2011-0126274

(51) Int. Cl.
*H01L 51/56* (2006.01)
*H01L 51/52* (2006.01)
*H01S 3/08* (2006.01)

(52) U.S. Cl.
CPC ........ *H01L 51/5265* (2013.01); *H01S 3/08086* (2013.01)

(58) Field of Classification Search
CPC .............. H01L 51/5265; H01S 3/0604; H01S 3/08086; Y10S 428/917
USPC ........................... 257/E51.021; 313/110, 111
See application file for complete search history.

(56) References Cited

U.S. PATENT DOCUMENTS

| 2005/0280008 | A1* | 12/2005 | Ricks et al. ...................... 257/79 |
| 2007/0273279 | A1* | 11/2007 | Kobayashi .................... 313/507 |
| 2008/0143649 | A1  | 6/2008  | Asaki et al. |
| 2008/0203908 | A1* | 8/2008  | Hasegawa et al. ............ 313/504 |
| 2012/0007083 | A1  | 1/2012  | You et al. |

FOREIGN PATENT DOCUMENTS

| JP | 2010-062067   | 3/2010  |
| JP | 2010-238677   | 10/2010 |
| KR | 10-2012-0004785 | 1/2012 |

\* cited by examiner

*Primary Examiner* — Thomas L Dickey
(74) *Attorney, Agent, or Firm* — Lee & Morse, P.C.

(57) ABSTRACT

An organic light emitting display apparatus including sub pixels, each of the sub pixels including: first and second electrodes, the second electrode extending over the first electrode; and an intermediate layer disposed between the first and second electrodes, the intermediate layer including an emission layer, wherein a first portion of the first electrode, the second electrode, and the intermediate layer extends within a weak resonance region, the weak resonance region being configured to induce a first resonance of light generated by the emission layer between the first and second electrodes, and a second portion of the first electrode, the second electrode, and the intermediate layer extends within a strong resonance region, the strong resonance region being configured to induce a second resonance of light generated by the emission layer between the first and second electrodes, the second resonance being stronger than the first resonance.

18 Claims, 4 Drawing Sheets

ORGANIC LIGHT EMITTING DISPLAY APPARATUS

CROSS-REFERENCE TO RELATED PATENT APPLICATION

This application claims the benefit of Korean Patent Application No. 10-2011-0126274, filed on Nov. 29, 2011, in the Korean Intellectual Property Office, the disclosure of which is incorporated herein in its entirety by reference.

BACKGROUND

1. Field

The embodiments relate to an organic light emitting display apparatus.

2. Description of the Related Art

In general, an organic light emitting display apparatus displays colors by emitting light when holes and electrons that are injected from an anode and a cathode are recombined in an emission layer. The organic light emitting display has a stacked structure in which an emission layer is inserted between a pixel electrode that is an anode and a counter electrode that is a cathode.

A unit pixel of an organic light emitting display apparatus includes red, green, and blue sub pixels which are combined to display a desired color. In more detail, each sub pixel has a structure in which an emission layer for emitting red, green, or blue light is disposed between two electrodes, and a unit pixel displays a color by appropriately combining the red, green, and blue light.

Meanwhile, currently, in many cases, sub pixels are formed in a resonance structure in order to increase light extraction efficiency of an organic light emitting display apparatus. That is, the resonance structure induces constructive interference of light between two electrodes by forming one of an anode and a cathode for displaying an image as a translucent electrode, and forming the other as a total reflection electrode, and thus a quite enhanced light may be extracted from each sub pixel.

However, if a strong resonance structure is used, although light extraction efficiency is increased, viewing angle characteristics may deteriorate. For example, if a strong resonance structure is used, a significant brightness reduction and color shift may occur, according to a viewing angle.

Accordingly, in order to implement a product having high reliability, a new structure capable of improving light extraction efficiency and satisfactorily maintaining viewing angle characteristics is required.

SUMMARY

One or more embodiments may provide an organic light emitting display apparatus including sub pixels, each of the sub pixels including: first and second electrodes, the second electrode extending over the first electrode; and an intermediate layer disposed between the first and second electrodes, the intermediate layer including an emission layer, wherein a first portion of the first electrode, a first portion of the second electrode, and a first portion of the intermediate layer extends within a weak resonance region, the weak resonance region being configured to induce a first resonance of light generated by the emission layer between the first and second electrodes, and a second portion of the first electrode, a second portion of the second electrode, and a second portion of the intermediate layer extends within a strong resonance region, the strong resonance region being configured to induce a second resonance of light generated by the emission layer between the first and second electrodes, the second resonance being stronger than the first resonance.

The organic light emitting display apparatus may further include a mirror layer for resonating the light between the first and second electrodes, the mirror layer including a first portion in the weak resonance region and a second portion in the strong resonance region, the second portion of the mirror layer being thicker than the first portion of the mirror layer. The mirror layer may include a dielectric mirror layer, a first portion of the dielectric mirror layer extending in the weak resonance region, and a second portion of the dielectric mirror layer extending in the strong resonance region. The dielectric mirror layer may include alternately stacked layers of silicon oxide (SiOx) and silicon nitride (SiNx), and the second portion of the dielectric mirror layer may include a larger number of stacked layers than the first portion of the dielectric mirror layer.

The mirror layer may include a dielectric mirror layer, a first portion of the dielectric mirror layer extending in the weak resonance region, and a second portion of the dielectric mirror layer extending in the strong resonance region, and a metal mirror layer extending only in the strong resonance region. The metal mirror layer may include a silver (Ag) layer, and the dielectric mirror layer may include alternately stacked layers of SiOx and SiNx.

The intermediate layer may further include a hole injection layer, a hole transporting layer, an electron injection layer, and an electron transporting layer for respectively injecting and transporting holes and electrons into the emission layer. A thickness of a portion of the hole transporting layer in the weak resonance region may be different from a thickness of a portion of the hole transporting layer in the strong resonance region, to facilitate adjusting resonance of light between the first and second electrodes.

One or more embodiments may provide an organic light emitting display apparatus including a plurality of unit pixels, each of the unit pixels including sub pixels for emitting light of different colors, the plurality of unit pixels including weak resonance unit pixels for inducing a first resonance, and strong resonance unit pixels for inducing a second resonance, the second resonance being stronger than the first resonance. Each of the sub pixels may include first and second electrodes, the second electrode extending over the first electrode, an intermediate layer disposed between the first and second electrodes, the intermediate layer including an emission layer and a mirror layer for resonating light generated by the emission layer between the first and second electrodes, the mirror layer including a first portion in the weak resonance unit pixels and a second portion in the strong resonance unit pixels, wherein the second portion of the mirror layer is thicker than the first portion of the mirror layer.

The mirror layer may include a dielectric mirror layer, a first portion of the dielectric mirror layer in the weak resonance unit pixels, and a second portion of the dielectric mirror layer in the strong resonance unit pixels. The dielectric mirror layer may include alternately stacked layers of silicon oxide (SiOx) and silicon nitride (SiNx), and the second portion of the dielectric mirror layer includes a larger number of stacked layers than the first portion of the dielectric mirror layer. The mirror layer may include a dielectric mirror layer, a first portion of the dielectric mirror layer in the sub pixels of the weak resonance unit pixels, and a second portion of the dielectric mirror layer in the sub pixels of the strong resonance unit pixels; and a metal mirror layer formed in the sub pixels of only the strong resonance unit pixels. The metal mirror layer may include a silver (Ag) layer, and the dielectric mirror layer may include alternately stacked layers of SiOx and SiNx. The intermediate layer may further include a hole injection layer, a hole transporting layer, an electron injection layer, and an electron transporting layer for respectively injecting and transporting holes and electrons into the emission layer. A thickness of a portion of the hole transporting layer in the sub pixels of the weak resonance unit pixels is different from a thickness of a portion of the hole transporting layer in the sub pixels of the strong resonance unit pixels, to facilitate adjusting resonance of light between the first and second electrodes.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

Hereinafter, the embodiments will be described in detail by explaining embodiments with reference to the attached drawings.

Figure 1:
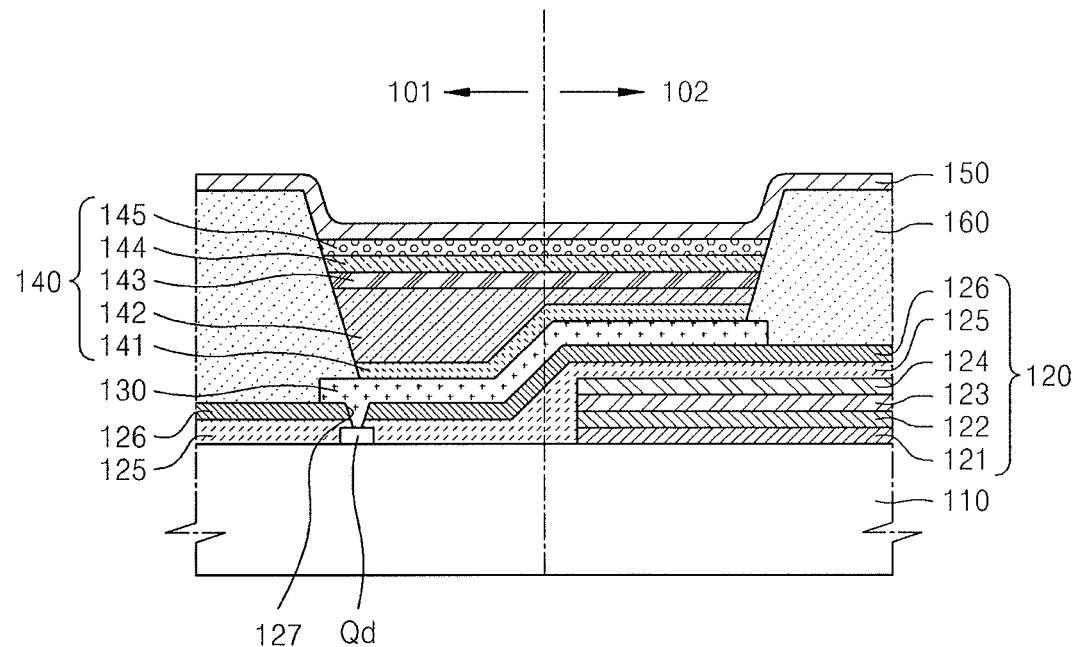
FIG. 1 illustrates a cross-sectional view of a sub pixel of an organic light emitting display apparatus, according to an embodiment.
Figure 2:
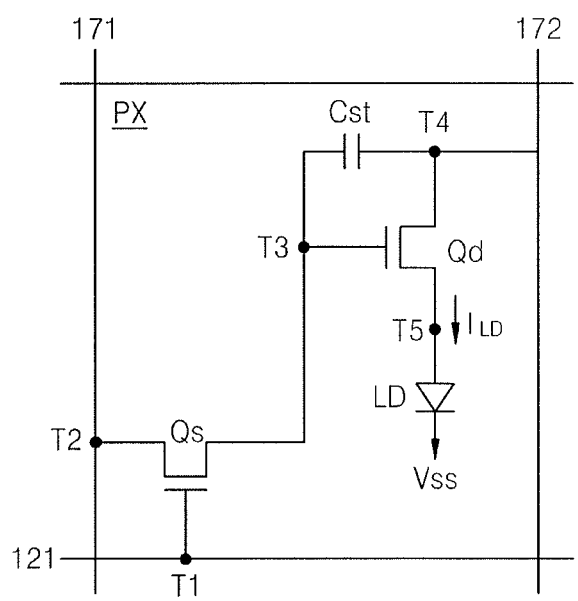
FIG. 2 illustrates an equivalent circuit diagram of the sub pixel illustrated in FIG. 1.

FIG. 1 illustrates a cross-sectional view of a sub pixel for forming a unit pixel of an organic light emitting display apparatus, according to an embodiment. FIG. 2 illustrates an equivalent circuit diagram of the sub pixel illustrated in FIG. 1. The unit pixel may include three-color sub pixels such as a red sub pixel R, a green sub pixel G, and a blue sub pixel B. FIG. 1 illustrates one sub pixel. The green and blue sub pixels G and B, may also have the structure illustrated in FIG. 1. Also, in the organic light emitting display apparatus, unit pixels each having the three-color sub pixels may be repeatedly aligned in row and column directions.

Referring to FIG. 2, a plurality of signal lines (121, 171, and 172) may be connected to a sub pixel PX.

The signal lines may include a scanning signal line 121 for transmitting a gate signal (or a scanning signal), a data line 171 for transmitting a data signal, and a driving voltage line 172 for transmitting a driving voltage.

The sub pixel PX may include a switching transistor Qs, a driving transistor Qd, a storage capacitor Cst, and an organic light emitting element LD.

The switching transistor Qs may include a control terminal T1, an input terminal T2, and an output terminal T3, wherein the control terminal T1 is connected to the scanning signal line 121, the input terminal T2 is connected to the data line 171, and the output terminal T3 is connected to the driving transistor Qd. The switching transistor Qs may transmit the data signal received from the data line 171 to the driving transistor Qd in response to the scanning signal received from the scanning signal line 121.

The driving transistor Qd may include a control terminal T3, an input terminal T4, and an output terminal T5, wherein the control terminal T3 is connected to the switching transistor Qs, the input terminal T4 is connected to the driving voltage line 172, and the output terminal T5 is connected to the organic light emitting element LD. The output terminal T3 of the switching transistor Qs may function as the control terminal T3 of the driving transistor Qd. The driving transistor Qd may provide an output current ILD having a variable size according to a voltage applied between the control terminal T3 and the output terminal T5.

The storage capacitor Cst may be connected between the control terminal T3 and the input terminal T4 of the driving transistor Qd. The storage capacitor Cst may charge the data signal applied to the control terminal T3 of the driving transistor Qd and retain the data signal even after the switching transistor Qs is turned off.

The organic light emitting element LD may include a pixel electrode connected to the output terminal T5 of the driving transistor Qd (hereinafter referred to as a first electrode), a counter electrode connected to a common voltage line Vss (hereinafter referred to as a second electrode), and an emission layer disposed between the first and second electrodes and for emitting light due to a voltage applied between the first and second electrodes.

The detailed structure of the organic light emitting element LD will be described with reference to FIG. 1.

Referring to FIG. 1, initially, the driving transistor Qd may be formed on an insulating substrate 110 formed of transparent glass or plastic. Although not shown in FIG. 1, the switching transistor Qs and the signal lines (121, 171, and 172) illustrated in FIG. 2 may also be formed on the insulating substrate 110.

A mirror layer 120 may be a dielectric mirror layer formed on the driving transistor Qd. A first electrode 130 may be connected to the driving transistor Qd via a contact hole 127 formed on the mirror layer 120.

An intermediate layer 140, including an emission layer 143, and a second electrode 150 may be sequentially stacked on the first electrode 130, and a sealing layer (not shown) for preventing penetration of moisture and oxygen may be further formed on the second electrode 150. For example, the second electrode 150 may extend over the first electrode 130. A reference numeral 160 indicates a pixel defining layer.

The mirror layer 120 may reflect light generated by the emission layer 143 to be resonated between the first and second electrodes 130 and 150. The mirror layer 120 may divide each sub pixel into weak and strong resonance regions 101 and 102. For example, in FIG. 1, a left region of the sub pixel may be the weak resonance region 101, and a right region of the sub pixel may be the strong resonance region 102. A first portion of the mirror layer may be in the weak resonance region 101 and a second portion of the mirror layer may be in the strong resonance regions 102. The first portion of the mirror layer 120 may have a two-layered structure in which a silicon oxide (SiOx) layer 125 and a silicon nitride (SiNx) layer 126 are stacked, e.g., the silicon nitride (SiNx) layer 126 may be stacked on the silicon oxide (SiOx) layer 125. The second portion of the mirror layer 120 may have a four-layered structure in which SiNx layers 121 and 123 and SiOx layers 122 and 124 are stacked. Furthermore, the SiOx layer 125 and the SiNx layer 126 of the weak resonance region 101 may extend to the strong resonance region 102. As such, the second portion of the mirror layer 120 (in the strong resonance region 102) may have a six-layered structure. For example, the second portion of the mirror layer 120 (in the strong resonance region 102) may include a larger number of stacked layers than the first portion of the mirror layer 120 (in the weak resonance region 101).

In comparison to the mirror layer 120 having a relatively small number of stacked layers, the mirror layer 120 having a relatively large number of stacked layers may resonate light generated by the emission layer 143 between the first and second electrodes 130 and 150 more strongly. Accordingly, the strong resonance region 102, in which the mirror layer 120 includes a larger number of stacked layers, may induce a strong resonance in comparison to the weak resonance region 101. Thus, the strong resonance region 102 may have a higher light extraction efficiency than the weak resonance region 101. The weak resonance region 101, inducing a relatively weak resonance, may have a relatively low light extraction efficiency, but a relatively large viewing angle in comparison to the strong resonance region 102. For example, the strong resonance region 102 may increase light extraction efficiency and the weak resonance region 101 may ensure a sufficient viewing angle.

Also, according to the current embodiment, in addition to the mirror layer 120, the intermediate layer 140 (including the emission layer 143) may also be structured to divide the sub pixel into the weak and strong resonance regions 101 and 102. In the intermediate layer 140, a hole injection layer 141 and a hole transporting layer 142 (for respectively injecting and transporting holes into the emission layer 143), the emission layer 143, an electron injection layer 144 and an electron transporting layer 145 (for respectively injecting and transporting electrons into the emission layer 143), have different thicknesses according to the weak and strong resonance regions 101 and 102. The thickness of the hole transporting layer 142, in particular, may vary significantly between the weak and strong resonance regions 101 and 102. For example, the hole transporting layer 142 may have a significantly greater thickness in the weak resonance region 101 than in the strong resonance region 102. In general, resonance may induce constructive interference of light. Light generated by the emission layer 143 may efficiently cause constructive interference at a certain gap between the first and second electrodes 130 and 150. Accordingly, if the gap is adjusted, resonance may be induced strongly or weakly. In the current embodiment, the sub pixel may also be divided into the weak and strong resonance regions 101 and 102 by varying the thickness of the hole transporting layer 142 according to the weak and strong resonance regions 101 and 102.

Light generated by the emission layer 143 of one sub pixel may be emitted at different intensities according to the weak and strong resonance regions 101 and 102. For example, the strong resonance region 102 may emit light having a relatively high light extraction efficiency, and the weak resonance region 101 may emit light having a relatively low light extraction efficiency but ensuring a sufficient viewing angle. Consequently, light emitted from the weak resonance region 101 and light emitted from the strong resonance region 102 may be mixed in one sub pixel. An effect of improving both light extraction efficiency and viewing angle characteristics may be achieved by mixing weakly resonated light and strongly resonated light.

Light emitted from the strong resonance region 102 has increased intensity and directionality due to strong resonance. Accordingly, light extraction efficiency may be increased. However, due to a high directionality, a brightness level or a color coordinate of light may greatly vary even when a viewing angle is slightly out of the center of a screen. On the other hand, the weak resonance region 101 may not increase light extraction efficiency but may have better viewing angle characteristics than the strong resonance region 102. Therefore, an effect of improving light extraction efficiency may be achieved in comparison to a sub pixel including only the weak resonance region 101, while better viewing angle characteristics may be achieved in comparison to a sub pixel including only the strong resonance region 102.

Accordingly, if the organic light emitting display apparatus according to the current embodiment is used, both light extraction efficiency and viewing angle characteristics may be improved.

Although the weak and strong resonance regions 101 and 102 of the sub pixel have similar sizes in the above embodiment, in some cases, the weak and strong resonance regions 101 and 102 may be asymmetrically formed to emphasize one effect. According to some embodiments, the strong resonance region 102 may have a larger size than the weak resonance region 101 in order to maximize light extraction efficiency. According to some embodiments, the weak resonance region 101 may have a larger size than the strong resonance region 102 in order to maximize viewing angle characteristics.

Figure 3:
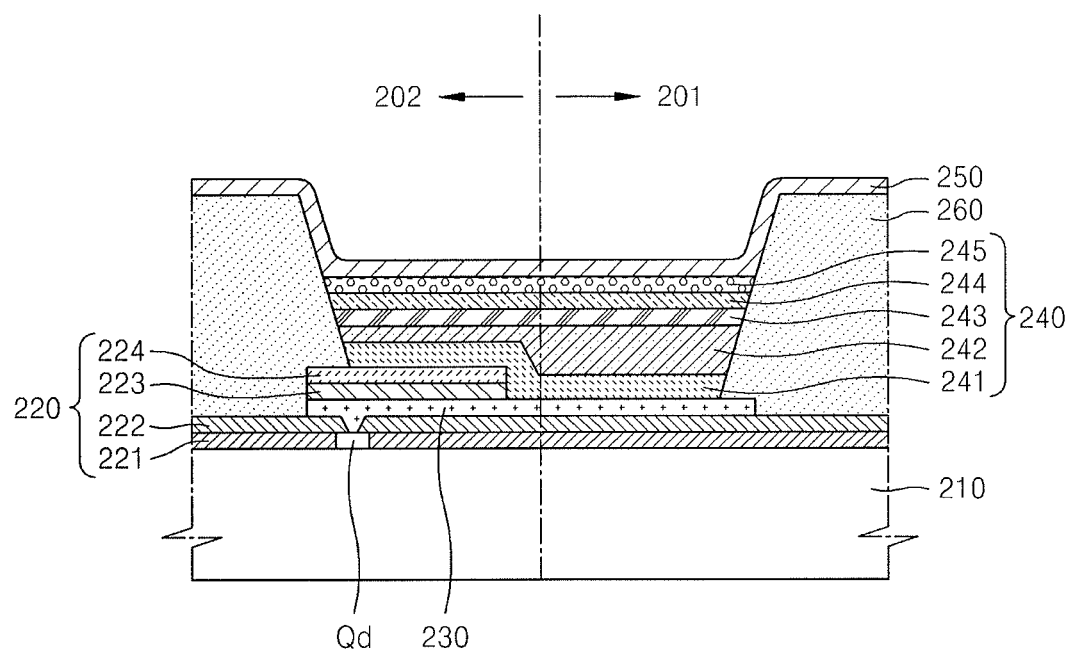
FIG. 3 illustrates a cross-sectional view of a sub pixel modified from FIG. 1, according to another embodiment.

FIG. 3 illustrates a cross-sectional view of a sub pixel modified from FIG. 1, according to another embodiment.

The sub pixel according to the current embodiment (illustrated in FIG. 3) also includes weak and strong resonance regions 201 and 202.

For example, like the sub pixel illustrated in FIG. 1, the sub pixel illustrated in FIG. 3 has a structure in which a mirror layer 220, a first electrode 230, an intermediate layer 240, and a second electrode 250 are sequentially stacked on a substrate 210, and the mirror layer 220 of the strong resonance region 202 is relatively thicker than that of the weak resonance region 201.

However, in the current embodiment, the mirror layer 220 of the strong resonance region 202 may further include a metal mirror layer (223 and 224), while the mirror layer 220 of the weak resonance region 201 may not. The mirror layer 220 of the weak resonance region 201 may be formed as a dielectric mirror layer having a two-layered structure in which a SiNx layer 221 and a SiOx layer 222 are stacked. The mirror layer 220 of the strong resonance region 202 may further include a metal mirror layer including a silver (Ag) layer 223 and an indium tin oxide (ITO) layer 224 sequentially stacked on the first electrode 230 (formed on the dielectric mirror layer). Due to the above enhanced structure, the strong resonance region 202 may induce a more enhanced resonance in comparison to the weak resonance region 201, and thus light extraction efficiency may be improved. A problem of narrowing a viewing angle may be compensated by the weak resonance region 201, as described above in relation to FIG. 1.

The intermediate layer 240 may also be structured as described above for the previous embodiment (illustrated in FIG. 1). For example, in the intermediate layer 240, a hole injection layer 241, a hole transporting layer 242, an emission layer 243, an electron transporting layer 244, and an electron injection layer 245, may have different thicknesses according to the weak and strong resonance regions 201 and 202, such that the strong resonance region 202 induces a stronger resonance. The thickness of the hole transporting layer 242, in particular, may vary significantly between the weak and strong resonance regions 201 and 202. For example, the hole transporting layer 242 may have a significantly greater thickness in the weak resonance region 201 than in the strong resonance region 202. The organic light emitting display apparatus may further include a pixel defining layer 260

The organic light emitting display apparatus according to the current embodiment may achieve an effect of improving both light extraction efficiency and viewing angle characteristics.

Although one sub pixel may be divided into a strong resonance region and a weak resonance region, as described above, the principles described above may be applied to units of pixels as described below.

Figure 4:
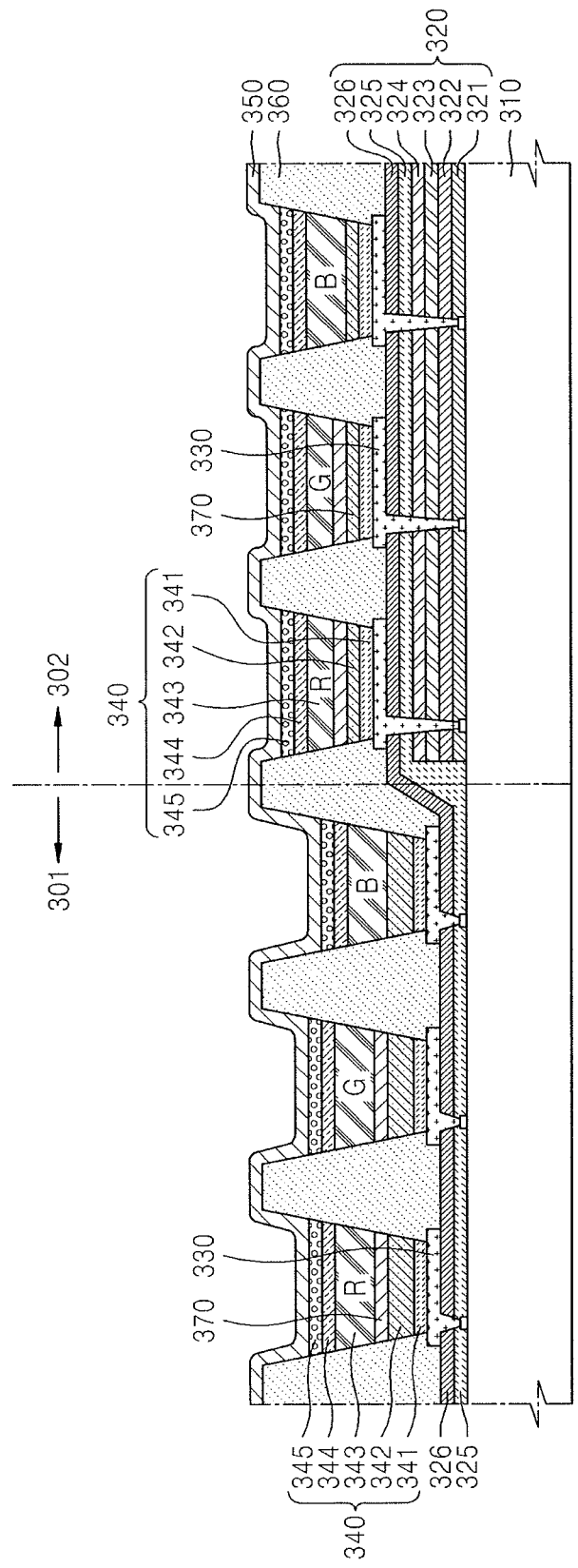
FIG. 4 illustrates a cross-sectional view of unit pixels of an organic light emitting display apparatus, according to an embodiment.

FIG. 4 illustrates a cross-sectional view of unit pixels of an organic light emitting display apparatus, according to an embodiment. The sub pixel structure illustrated in FIG. 1 is incorporated in the units of pixels of FIG. 4.

In general, a pixel, i.e., a unit pixel, includes three-color (red, green, and blue) sub pixels. In FIG. 4, weak and strong resonance unit pixels 301 and 302 may be alternately aligned. On a plane, the weak and strong resonance unit pixels 301 and 302 may be alternately aligned in row and column directions.

In the weak resonance unit pixel 301, a mirror layer 320 on a substrate 310 has a two-layered structure in which a SiOx layer 325 and a SiNx layer 326 are stacked. However, in the strong resonance unit pixel 302, the mirror layer 320 has a six-layered structure including the two-layered structure (325 and 326) and a four-layered structure in which SiNx layers 321 and 323 and SiOx layers 322 and 324 are stacked. A pixel defining layer 360 and a gap adjusting electrode 370 may further be provided. The gap adjusting electrode may adjust a gap between the first and second electrodes 330 and 350 to be appropriate for a resonance condition of each sub pixel.

An intermediate layer 340 between first and second electrodes 330 and 350 may have slightly different structures when same-color sub pixels of the weak and strong resonance unit pixels 301 and 302 are compared. In the intermediate layer 340, a hole injection layer 341, a hole transporting layer 342, an emission layer 343, an electron transporting layer 344, and an electron injection layer 345, particularly, the hole transporting layer 342 may have different thicknesses when same-color sub pixels of the weak and strong resonance unit pixels 301 and 302 are compared. Thus, as described above in relation to FIG. 1, the strong resonance unit pixel 302 may induce a stronger resonance.

Accordingly, light emitted from the weak resonance unit pixel 301 and light emitted from the strong resonance unit pixel 302 may be mixed. An effect of improving both light extraction efficiency and viewing angle characteristics may be achieved by mixing weakly resonated light and strongly resonated light.

Figure 5:
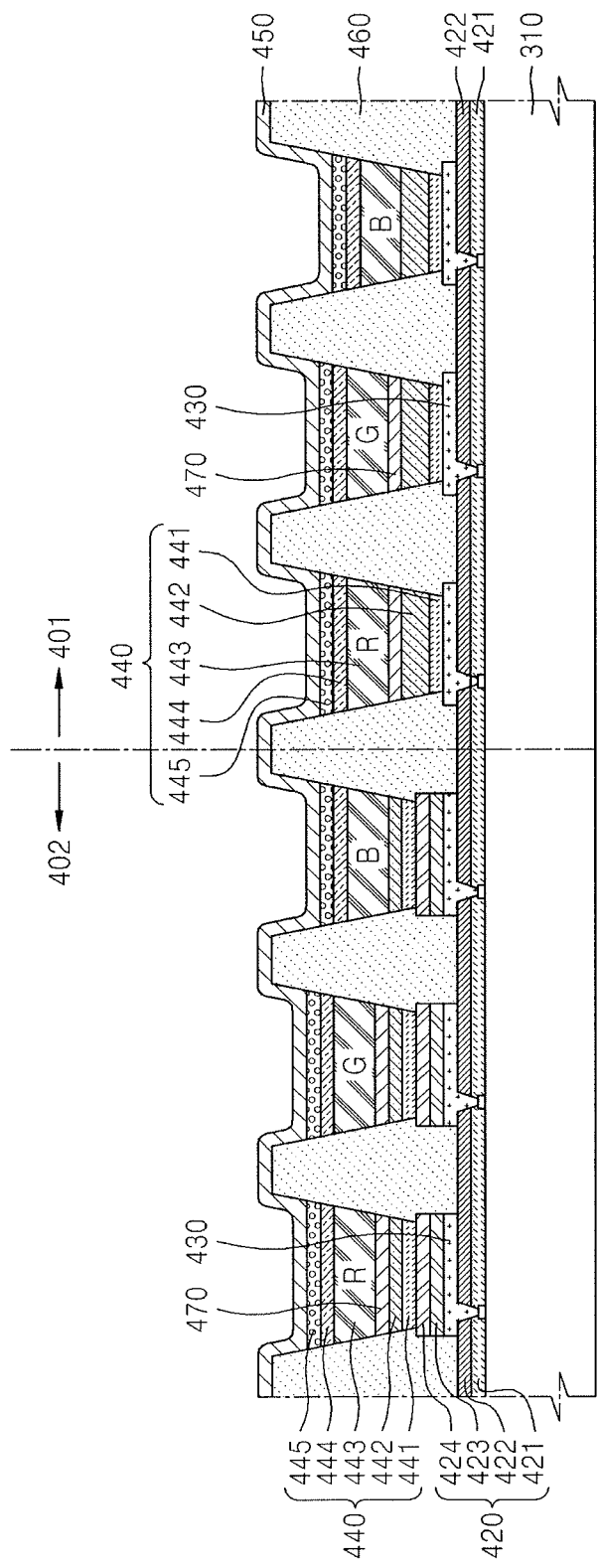
FIG. 5 illustrates a cross-sectional view of unit pixels modified from FIG. 4, according to another embodiment.

FIG. 5 illustrates a cross-sectional view of unit pixels according to another embodiment. The sub pixel structure illustrated in FIG. 3 is incorporated in the units of pixels of FIG. 5.

Weak and strong resonance unit pixels 401 and 402 each including three-color (red, green, and blue) sub pixels may be alternately aligned. On a plane, the weak and strong resonance unit pixels 401 and 402 may be alternately aligned in row and column directions.

A mirror layer 420 of the weak resonance unit pixel 401 may be formed as a dielectric mirror layer having a two-layered structure in which a SiNx layer 421 and a SiOx layer 422 are stacked. The mirror layer 420 of the strong resonance unit pixel 402 may further include a metal mirror layer including an Ag layer 423 and an ITO layer 424 sequentially stacked on a first electrode 430 (formed on the dielectric mirror layer). Due to the above enhanced structure, the strong resonance unit pixel 402 may induce a much enhanced resonance in comparison to the weak resonance unit pixel 401. Thus, light extraction efficiency may be improved. A problem of narrowing a viewing angle may be compensated by the weak resonance unit pixel 401, as described above in relation to FIG. 1.

An intermediate layer 440 between first and second electrodes 430 and 450 may have slightly different structures when same-color sub pixels of the weak and strong resonance unit pixels 401 and 402 are compared. In the intermediate layer 440, a hole injection layer 441, a hole transporting layer 442, an emission layer 443, an electron transporting layer 444, and an electron injection layer 445, particularly, the hole transporting layer 442 may have different thicknesses when same-color sub pixels of the weak and strong resonance unit pixels 401 and 402 are compared. Thus, as described above in relation to FIG. 3, the strong resonance unit pixel 402 may induce a stronger resonance.

A pixel defining layer 460, a gap adjusting electrode 470 may also be provided. The gap adjusting electrode 470 may adjust a gap between the first and second electrodes 430 and 450 to be appropriate for a resonance condition of each sub pixel.

Accordingly, light emitted from the weak resonance unit pixel 401 and light emitted from the strong resonance unit pixel 402 may be mixed. An effect of improving both light extraction efficiency and viewing angle characteristics may be achieved by mixing weakly resonated light and strongly resonated light.

As described above, since an organic light emitting display apparatus according to an embodiment may include strong and weak resonance structures, both light extraction efficiency and viewing angle characteristics may be improved. Thus, a product having a high reliability may be implemented by using the organic light emitting display apparatus.

While the embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. organic light emitting display apparatus comprising a plurality of unit pixels, each unit pixel having at least two sub pixels, a first one of the sub pixels to emit only a first color of light and a second one of the sub pixels to emit only a second color of light, the first and second colors of light being different colors of light, and each of the at least two sub pixels including:
    a first resonance region;
    a second resonance region;
    first and second electrodes, the second electrode extending over the first electrode; and
    an intermediate layer disposed between the first and second electrodes, the intermediate layer including an emission layer, wherein in each of the at least two sub pixels:
    a first portion of the first electrode, a first portion of the second electrode, and a first portion of the intermediate layer extends within the first resonance region, the first resonance region to induce a first resonance of light based on light generated by the first portion of the intermediate layer including the emission layer between the first and second electrodes, and
    a second portion of the first electrode, a second portion of the second electrode, and a second portion of the intermediate layer extends within the second resonance region, the second resonance region to induce a second resonance of light based on light generated by the second portion of the intermediate layer including the emission layer between the first and second electrodes, the second resonance being stronger than the first resonance.

2. The organic light emitting display apparatus of claim 1, further including a mirror layer for resonating the light between the first and second electrodes, the mirror layer including a first portion in the first resonance region and a second portion in the second resonance region, the second portion of the mirror layer being thicker than the first portion of the mirror layer.

3. The organic light emitting display apparatus of claim 2, wherein the mirror layer includes a dielectric mirror layer, a first portion of the dielectric mirror layer extending in the first resonance region, and a second portion of the dielectric mirror layer extending in the second resonance region.

4. The organic light emitting display apparatus of claim 3, wherein:
the dielectric mirror layer includes alternately stacked layers of silicon oxide (SiOx) and silicon nitride (SiNx), and
the second portion of the dielectric mirror layer includes a larger number of stacked layers than the first portion of the dielectric mirror layer.

5. The organic light emitting display apparatus of claim 2, wherein the mirror layer includes:
a dielectric mirror layer, a first portion of the dielectric mirror layer extending in the first resonance region, and a second portion of the dielectric mirror layer extending in the second resonance region; and
a metal mirror layer extending only in the second resonance region.

6. The organic light emitting display apparatus of claim 5, wherein:
the metal mirror layer includes a silver (Ag) layer, and
the dielectric mirror layer includes alternately stacked layers of SiOx and SiNx.

7. The organic light emitting display apparatus of claim 1, wherein the intermediate layer further includes a hole injection layer, a hole transporting layer, an electron injection layer, and an electron transporting layer for respectively injecting and transporting holes and electrons into the emission layer.

8. The organic light emitting display apparatus of claim 7, wherein a thickness of a portion of the hole transporting layer in the first resonance region is different from a thickness of a portion of the hole transporting layer in the second resonance region, to facilitate adjusting resonance of light between the first and second electrodes.

9. The organic light emitting display apparatus of claim 1, wherein the first and second portions of the intermediate layer including the emission layer include a same light emitting material in the first and second resonance regions.

10. The organic light emitting display apparatus of claim 1, wherein the emission layer has substantially a same thickness in the first and second resonance regions.

11. The organic light emitting display apparatus of claim 10, wherein the first and second electrodes are spaced by a first distance in the first resonance region, wherein the first and second electrodes are spaced by a second distance in the second resonance region, and wherein the first distance is different from the second distance.

12. The organic light emitting display apparatus of claim 11, wherein the first distance is greater than the second distance.

13. The organic light emitting display apparatus of claim 11, wherein further comprising a functional layer between the first and second electrodes in the first and second resonance regions, the functional layer having a first thickness in the first resonance region and a second thickness in the second resonance region, and wherein the first thickness is different from the second thickness.

14. The organic light emitting display apparatus of claim 13, wherein the function layer is a hole transporting layer.

15. A sub pixel to emit a single color of light, comprising:
a first resonance region between first and second electrodes;
a second resonance region between the first and second electrodes; and
an emission layer between the first and second electrodes and extending into the first and second resonance regions, wherein the first resonance region has a first light extraction efficiency and a first light intensity based on a first resonance of light in the first resonance region, and the second resonance region has a second light extraction efficiency and a second light intensity based on a second resonance of light in the second resonance region, wherein the second resonance of light is different from the first resonance of light, and wherein the second light extraction efficiency and the second light intensity are different from the first light extraction efficiency and the first light intensity.

16. The sub pixel as claimed in claim 15, wherein:
at least one layer between the first and second electrodes has a first thickness in the first resonance region and a second thickness in the second resonance region, and
the first thickness is different from the second thickness.

17. The sub pixel as claimed in claim 16, wherein the at least one layer includes a hole transport layer.

18. The sub pixel as claimed in claim 15, wherein:
the first resonance region has a first viewing angle characteristic, and the second resonance region has a second viewing angle characteristic different from the first viewing angle characteristic.

* * * * *